(12) United States Patent
Donkers et al.

(10) Patent No.: US 9,917,187 B2
(45) Date of Patent: Mar. 13, 2018

(54) SEMICONDUCTOR DEVICE AND MANUFACTURING METHOD

(71) Applicant: Nexperia B.V., Nijmegen (NL)

(72) Inventors: Johannes Josephus Theodorus Marinus Donkers, Eindhoven (NL); Stephan Bastiaan Simon Heil, Eindhoven (NL); Jan Sonsky, Louvain (BE)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 14/704,692

(22) Filed: May 5, 2015

(65) Prior Publication Data

US 2015/0325698 A1 Nov. 12, 2015

(30) Foreign Application Priority Data

May 8, 2014 (EP) .................................. 14167590

(51) Int. Cl.
*H01L 29/78* (2006.01)
*H01L 29/66* (2006.01)
*H01L 21/31* (2006.01)
*H01L 21/311* (2006.01)
*H01L 29/778* (2006.01)
(Continued)

(52) U.S. Cl.
CPC .... *H01L 29/7839* (2013.01); *H01L 21/28581* (2013.01); *H01L 21/31* (2013.01); *H01L 21/31111* (2013.01); *H01L 29/41725* (2013.01); *H01L 29/42316* (2013.01); *H01L 29/452* (2013.01); *H01L 29/475* (2013.01); *H01L 29/66462* (2013.01); *H01L 29/7786* (2013.01); *H01L 29/7787* (2013.01); *H01L 29/2003* (2013.01)

(58) Field of Classification Search
CPC ........... H01L 29/7839; H01L 21/28581; H01L 29/475; H01L 29/7786
See application file for complete search history.

(56) References Cited

U.S. PATENT DOCUMENTS 6,011,281 A * 1/2000 Nunokawa ............ H01L 29/452
257/192
6,998,649 B2 * 2/2006 Hata ...................... B82Y 20/00
257/745

(Continued)

OTHER PUBLICATIONS

Donkers et al. 600V-900V GaN-on-Si Process Technology for Schottky Barrier Diodes and Power Switches Fabricated in a Standard Si-Production Fab, CS MANTECH Conf., pp. 259-262 (May 2013).

(Continued)

*Primary Examiner* — Tom Thomas
*Assistant Examiner* — Vincent Wall
(74) *Attorney, Agent, or Firm* — Ohlandt, Greeley, Ruggiero & Perle, L.L.P.

(57) ABSTRACT

A semiconductor device comprising at least one active layer on a substrate and a first contact to the at least one active layer, the first contact comprising a metal in contact with the at least one active layer and a capping layer on the metal, the capping layer comprising a diffusion barrier, wherein the capping layer is patterned to form a pattern comprising regions of the contact covered by the capping layer and regions of the contact that are uncovered.

12 Claims, 3 Drawing Sheets

(51) Int. Cl.
*H01L 29/45* (2006.01)
*H01L 29/423* (2006.01)
*H01L 29/417* (2006.01)
*H01L 21/285* (2006.01)
*H01L 29/47* (2006.01)
*H01L 29/20* (2006.01)

(56) References Cited

U.S. PATENT DOCUMENTS

| | | | | |
|---|---|---|---|---|
| 7,274,040 | B2* | 9/2007 | Sun | H01L 33/005 257/100 |
| 8,026,568 | B2* | 9/2011 | Zhu | H01L 21/28581 257/471 |
| 8,823,031 | B2* | 9/2014 | Kususe | H01L 33/405 257/13 |
| 2004/0134974 | A1* | 7/2004 | Oh | B23K 3/0623 228/245 |
| 2005/0104220 | A1* | 5/2005 | Tsuchiya | H01L 24/10 257/774 |
| 2005/0116253 | A1* | 6/2005 | Yamane | H01L 21/8252 257/194 |
| 2006/0157735 | A1* | 7/2006 | Kanamura | H01L 29/42316 257/194 |
| 2010/0148199 | A1* | 6/2010 | Kim | H01L 33/44 257/98 |
| 2010/0207157 | A1* | 8/2010 | Schiaffino | H01L 33/0079 257/99 |
| 2011/0272818 | A1* | 11/2011 | Jeong | H01L 23/585 257/774 |
| 2014/0001640 | A1* | 1/2014 | Nishizawa | H01L 29/402 257/773 |
| 2014/0124821 | A1* | 5/2014 | Tomonari | H01L 33/38 257/99 |
| 2014/0306232 | A1* | 10/2014 | Donkers | H01L 21/28575 257/76 |
| 2015/0243578 | A1* | 8/2015 | Botula | H01L 21/4882 257/288 |

OTHER PUBLICATIONS

Extended European Search Report for EP Patent Appln. No. 14176489.4 (dated Oct. 8, 2015).

* cited by examiner

SEMICONDUCTOR DEVICE AND MANUFACTURING METHOD

CROSS-REFERENCE TO RELATED APPLICATIONS

This application claims the priority under 35 U.S.C. § 119 of European patent application no. 14167590.0, filed on May 8, 2014, the contents of which are incorporated by reference herein.

The present invention relates to a semiconductor device comprising at least one active layer such as a GaN layer on a substrate and a first contact to the at least one active layer, the first contact comprising a metal in contact with the at least one active layer. The present invention further relates to a method of manufacturing such a semiconductor device.

Group III-V nitrides such as Gallium Nitride (GaN) have drawn interest as promising materials for high-temperature and high-power electronics. Future high-efficiency power converters require fast switching, low conduction loss devices that can handle high voltages. GaN is a good candidate for voltages up to 1 kV and shows excellent switching behaviour in Schottky diodes and in high-electron mobility transistors (HEMTs). Thanks to the advancements in Gallium Nitride on Silicon (GaN-on-Si) epitaxy, the semiconductor industry is now actively combining III-V specific device expertise with low-cost high-volume Si main-stream production facilities.

One of the key considerations for main-stream Silicon compatibility is the choice of metals used and as the technology advances, more stringent demands will be made on the reproducibility, uniformity, thermal stability, and high temperature operation of GaN-based semiconductor devices.

Most ohmic contacts on GaN/AlGaN heterostructures are based on Ti/Al-based metallization schemes. Titanium creates nitrogen vacancies in the underlying GaN by forming TiN, which enables electrons to tunnel to the 2-dimensional electron gas (2DEG) that occurs underneath the AlGaN. Aluminium is included to react with the Titanium to prevent oxidation of the Ti. On top of the Al, gold is commonly used as the bulk metal, often separated by a diffusion barrier. Common metallization structures include Ti/Al/Ti/Au, Ti/Al/Ni/Au and Ti/Al/Pt/Au.

Such semiconductor devices may further or alternatively include a Schottky contact, which may comprise a nickel (Ni) layer in contact with the at least one active layer of the semiconductor device. It has been found that when aluminium is used as the metal of the backend, aluminium can diffuse into the nickel, which negatively affects the properties of the Schottky contact.

According to a first aspect of the invention we provide a semiconductor device comprising at least one active layer on a substrate and a first contact to the at least one active layer, the first contact comprising a metal in contact with the at least one active layer and a capping layer on the metal, the capping layer comprising a diffusion barrier, wherein the capping layer is patterned to form a pattern comprising regions of the contact covered by the capping layer and regions of the contact that are uncovered.

It has been found that the patterned capping layer, by virtue of its thermal properties and barrier properties, may prevent delamination between the first contact metal and an insulating layer, which may electrically isolate the contact, while having a low adverse effect on the electrical characteristics of the contact. Thus, while a capping layer typically continuously covers the contact over an upper or connection surface of the first contact from which an electrical connection to the contact can be formed, the capping layer pattern thus providing covered and uncovered regions of the upper or connection surface. It will be appreciated that "uncovered" may comprise covered to a lesser degree than the covered regions i.e. thinner regions of capping layer material.

The first contact may comprise a Schottky contact. The metal of the first contact may comprise Nickel (Ni).

The capping layer may comprise a hydrogen barrier material. The capping layer may comprise a metal layer of a metal different to that of the contact. The capping layer may comprise a dielectric layer. The capping layer may comprise Titanium and Tungsten and/or a titanium tungsten nitride TiW(N) layer in contact with the first contact metal. A metal capping layer may comprise TiN, W, WN or Pt. A dielectric capping layer may comprise a silicon oxide, a PECVD oxide, a spin on glass (SOG) oxides, an atomic layer deposition (ALD) deposited dielectric or an oxynitride.

The pattern may divide the capping layer into a plurality of strips. The covered region may thus comprise strips of capping layer material. The strips may comprise linear strips. The pattern may divide the capping layer into a plurality of dots. Thus, the covered region may thus comprise dots of capping layer material.

The device may comprise a backend metal layer on the patterned capping layer. The backend metal layer may comprise Aluminium. The backend metal layer may provide a connection point to/from the first contact of the device.

The first contact may be laterally delimited by an electrically insulating material, which may comprise a dielectric material. The capping layer may be arranged as a barrier to diffusion of hydrogen from the electrically insulating material. The pattern may be configured such that the capping layer extends substantially over an area to separate the first contact from the electrically insulating material deposited around the first contact. The pattern may be configured such that an area of an upper surface of the first contact that is aligned with an area of a lower surface of the contact that is in contact with the at least one active layer is substantially uncovered. The pattern may be configured such that the capping layer extends over lateral sides of the first contact. This may separate the contact from the electrically insulating material.

Optionally, the pattern is configured such that the covered regions abut the electrically insulting material and the uncovered regions abut a backend metal layer. Optionally, the electrically insulating layer comprises, at least in part, silicon oxide. Optionally, the electrically insulating layer comprises a sub-layer of silicon nitride formed on a passivation layer and a sub-layer of silicon oxide formed on the sub-layer of silicon nitride.

The capping layer may be formed on an upper or connection surface (which provides an electrical connection to the contact) of the first contact opposite the active layer. The area of uncovered region(s) may be greater over an area of the connection surface opposite where the contact contacts the at least one active layer than the remainder of the connection surface. The first contact may include a first surface having an active area contact region thereof configured to contact the at least one active layer and a second surface opposed to the first surface, the second surface configured to provide for electrical connection to the contact, wherein the second surface receives the capping layer, the second surface comprising a connection region where a connection to backend metallisation is formed and an active area region, the active area region opposite the active area contact region and wherein the covered region extends over the connection region and the uncovered region extends over the active area region.

The pattern may form a capping layer having at least one subsection that is thinner than the remainder of the capping layer. Thus, the capping layer has a thicker subsection and a thinner subsection.

The first contact may comprise a gate contact. The semiconductor device may include a further contact, the further contact comprising one of a source and drain contact. The semiconductor device may include two further contacts, a source contact and a drain contact.

The capping layer may comprise a stack of sub-layers including a first TiW sub-layer, a second TiW sub-layer and a TiW(N) sub-layer in-between the first and second TiW sub-layers. This may be the resulting structure from a process in which nitrogen is gradually introduced to and removed from the reactants in a reaction chamber of e.g. a sputter deposition tool, which ensures that no nitrogen is present in the reaction chamber to contaminate subsequent sputter targets for which the inclusion of nitrogen is undesirable.

The TiW(N) sub-layer preferably has a thickness exceeding the combined thickness of the first and second TiW sub-layers such that the properties of the sub-layer stack are dominated by the TiW(N) sub-layer.

Although the present invention can be applied in any suitable semiconductor device, the present invention is particularly suitable for application in a semiconductor device comprising a gallium nitride (GaN) active layer. An AlGaN layer may separate the GaN layer from the metal layer of the one or more contacts of the semiconductor device.

In accordance with another aspect of the present invention, there is provided a method of manufacturing a semiconductor device, the method comprising providing a substrate;
  forming at least one active layer on said substrate;
  forming a first contact on the at least one active layer by depositing a metal on the at least one active layer;
  depositing a capping layer over said metal;
  patterning the metal to form the first contact;
  patterning the capping layer to form a pattern comprising regions of the first contact covered by the capping layer and regions of the contact that are uncovered.

The method may comprise, after the deposition of the metal to form the first contact, performing the step of patterning the metal to form the first contact, performing an anneal step on the first contact, then depositing the capping layer over said metal. The method may then comprise patterning the capping layer with a larger gate length than the pattering of the metal to form the first contact.

The method may include the step of deposition of an electrically insulating material around the first contact to laterally delimit the first contact. The dielectric material may be an intermetal dielectric to electrically isolate the first contact. The dielectric material may be deposited by plasma enhanced chemical vapour deposition (PECVD). The dielectric material may comprise silicon oxide or a combination of a sub-layer of silicon oxide on a sub-layer of silicon nitride.

The step of patterning the capping layer to form a pattern may be performed by ion beam etching.

The method may include the step of controlling the Schottky barrier height of the first contact by controlling the area ratio of covered and uncovered regions of the capping layer over the first contact metal.

The method may include the step of depositing backend metal on the patterned capping layer of covered and uncovered regions of the first contact.

The capping layer may comprise a metal. The capping layer may comprise a dielectric. The capping layer may be applied by atomic layer deposition.

The capping layer may be comprise a TiW(N) layer. The TiW(N) capping layer may be deposited using sputter deposition. The step of depositing the capping layer may comprise depositing a first TiW sub-layer over the metal; depositing a TiW(N) sub-layer over the first TiW sub-layer and depositing a second TiW sub-layer over the TiW(N) sub-layer.

The metal may comprise nickel and it is preferable that the patterning of the metal contact is performed after the deposition of the capping layer as it has surprisingly been found that this effectively protects the nickel layer from delamination in subsequent processing steps.

The substrate may comprise a silicon substrate, a SiC substrate or a sapphire substrate. The at least one active layer may comprise a GaN layer. An AlGaN layer may be provided over the GaN layer, wherein the step of forming the first contact comprises forming said first contact on the AlGaN layer.

According to a third aspect of the invention we provide an integrated circuit (IC) including the semiconductor device as defined in the first aspect.

There now follows, by way of example only, a detailed description of embodiments of the invention with reference to the following figures, in which.

DETAILED DESCRIPTION OF THE DRAWINGS

It should be understood that the Figures are merely schematic and are not drawn to scale.

The present invention is based on the patterning of a capping layer formed on metal contacts in a semiconductor device. The capping layer can be advantageously used on top of metal contacts, in particular Ti/Al and Ni contacts, to improve the robustness of these contacts to subsequent processing steps in the formation of a semiconductor device, such as a diode, a transistor and others. The formation of a pattern in the capping layer may be used to ensure the effect of the capping layer on the electrical characteristics of the contact is low. In particular, when the contact is a Schottky contact, the formation of a pattern in the capping layer may ensure the effect of the capping layer of the Schottky barrier height is low. The use of a capping layer on such contacts has been found particularly beneficial if subsequent manufacturing steps of the semiconductor device expose the metal contacts to high temperature anneal steps. The present invention may be applied to any semiconductor technology, but is particularly advantageous when applied to gallium nitride (GaN)-based semiconductor devices where such thermal anneal steps are commonplace in the manufacturing process. More specifically, the present invention is particularly advantageous when applied to gallium nitride (GaN)-based semiconductor devices where mainstream Si-fab compatibility is required, for example GaN semiconductor devices for use in power, radio frequency (RF) and sensor applications.

Figure 1:
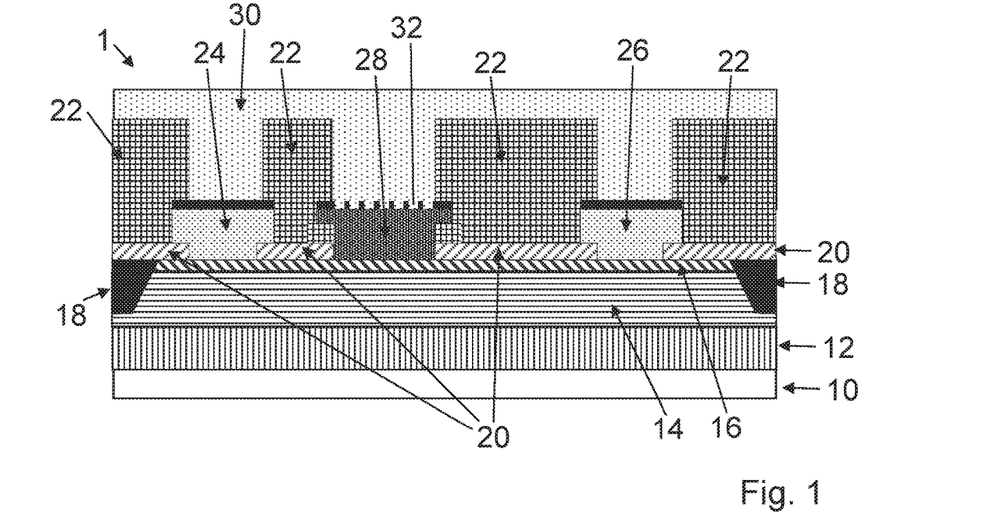
FIG. 1 shows schematically depicts a semiconductor device according to an embodiment of the present invention.

FIG. 1 shows, schematically, an example of such a GaN-based semiconductor device 1. In particular, a HEMT is shown. The semiconductor device comprises a substrate 10, such as a silicon substrate, onto which a buffer layer 12 is formed. The buffer layer 12 may for instance comprise GaN, AlGaN or a combination thereof. The semiconductor device comprises an active layer stack including a GaN layer 14 and an AlGaN layer 16. The semiconductor device may comprise isolation regions 18 to electrically separate adjacent semiconductor devices on a wafer. The isolation regions 18 for instance may be formed in any suitable manner, e.g. by etching a mesa into the active layer stack or by implanting an impurity such as argon into the active layer stack to locally disrupt the crystal structure such that the 2 dimensional electron gas can no longer form in this region. It should be understood that depending on the technology other types of isolation regions 18 may be used, e.g. using any suitable electrically insulating material such as silicon oxide, silicon-rich oxide, silicon nitride among others.

A passivation layer 20 is formed on the active layer stack 14, 16, which has been patterned to provide contact regions to the active layer stack. The passivation layer 20 may be any suitable dielectric material, such as silicon nitride. In this example, the semiconductor device is shown to have three contacts by way of non-limiting example only, namely ohmic contacts 24 and 26 and Schottky contact 28. It should however be understood that the semiconductor device may have any suitable number of contacts. The semiconductor device 1 may have only ohmic contacts or only Schottky contacts. The contacts 24, 26 and 28 are in conductive contact with the AlGaN layer 16 and are electrically insulated from each other by an electrically insulating material, such as dielectric material of an insulating layer 22, which may comprise silicon nitride or any other suitable material. In an embodiment, the contacts 24, 26 and 28 are in physical contact with the AlGaN layer 16. In an alternative embodiment, the contacts 24, 26 and 28 are separated from the AlGaN layer 16 by an active layer capping layer to prevent reaction of the AlGaN layer 16 when exposing an intermediate structure to dry or wet etch chemistries, e.g. when forming the openings for the contacts 24, 26 and 28. Such an active layer capping layer should be thin enough to allow the contacts 24, 26 and 28 to be conductively coupled to the AlGaN layer 16. For example, the active layer capping layer may be a GaN layer having a thickness of less than 10 nm, e.g. 2-3 nm. Preferably, the passivation layer 20 and the dielectric material of the insulating layer are the same material, such as silicon nitride. However, the dielectric material may comprise Silicon Oxide.

The first ohmic contact 24 may define a source electrode of the semiconductor device, the second ohmic contact 26 may define a drain electrode of the semiconductor device and the Schottky contact 28 may define a gate electrode of the semiconductor device. The first and second ohmic contacts 24, 26 each are typically formed of an metallization stack including a Ti layer in physical contact with the AlGaN layer 16 and an Al layer in physical contact with the Ti layer. Further layers may be present in each of these contacts. In order to obtain a low ohmic contact between the Ti layer and the AlGaN layer 16, a high temperature anneal step, e.g. around 800° C., is typically necessary. However, as these temperatures are above the melting point of aluminium, a capping layer may be present on the ohmic contacts to prevent the melting of the Al layer in the ohmic contacts.

The Schottky contact 28 typically contains nickel (Ni) as the metal in physical contact with the AlGaN layer 16. The use of Nickel is also not straightforward, especially when using aluminium for the backend metallization 30 of the semiconductor device. For the avoidance of doubt, the term backend metallization is used to indicate the metal structures on top of the semiconductor device that inter alia facilitate the connection of the contacts 24, 26, 28 to other circuit elements or to the outside world. The process of manufacturing the metallization of a semiconductor device is commonly referred to as the back-end process.

In order to obtain a good Schottky contact between the Ni of the Schottky contact 28 and the AlGaN layer 16, a high temperature anneal step, e.g. around 400-600° C., is typically necessary. However, at these temperatures the aluminium metallization 30 freely diffuses into the nickel contact, such that it is necessary to protect the nickel from the aluminium with a barrier.

A capping layer 32 is provided to protect the contacts 24, 26, 28. The capping layer 32 on the Schottky contact 28 is formed and patterned with a pattern, such that the capping layer 32 is divided into a plurality of capping layer regions, which are shown in more details in FIGS. 3a-3b and will be described below. Thus, the capping layer 32 includes a plurality of covered regions of capping layer material separated by regions where no capping material is present (or of a reduced thickness). Thus, the Schottky contact 28 is partially covered by the capping layer 28. In particular, the Schottky contact 28 includes regions where it is covered by the capping layer 32 and other regions where the Schottky contact 28 is open to the aluminum backend metallization 30. The patterned capping layer 28 thus separates the Schottky contact from the back-end metallisation over a first area (where capping layer material is present) and the Schottky contact 28 is in contact with the back-end metallization over a remaining, second area (where capping layer material is absent due to the pattern). The capping layer may comprise a covered region adjacent the dielectric material of the insulating layer 22.

The capping layer 32 may also cover the ohmic contacts 24, 26. The capping layer may or may not be patterned over the ohmic contacts 24, 26. Patterning of the capping layer 32 into a pattern of covered and uncovered regions has been found to have particular advantage in controlling the impact of the presence of the capping layer on the Schottky barrier height and may therefore only be present for Schottky contacts while an unpatterned capping layer may be applied to non-Schottky or ohmic contacts.

The capping layer 32 may be of TiW(N), although other materials may be used. The capping layer may comprise a hydrogen barrier layer. Thus, the capping layer may be of a material that can act as a barrier to hydrogen diffusion. The capping layer may comprise a dielectric material. A metal capping layer may comprise TiN, W, WN or Pt. A dielectric capping layer may comprise a silicon oxide, a PECVD oxide, a spin on glass (SOG) oxides, an atomic layer deposition (ALD) deposited dielectric or an oxynitride.

In the example where the capping layer 32 comprises TiW(N), it may be applied to the ohmic contacts 24, 26 and on the Schottky contact 28. The nitrogen content of the TiW(N) layer 32 may be in the range of 30-60 atom % based on the total atom composition of the TiW(N) layer 32, as an example only.

It has been found that for the ohmic contacts 24, 26, the TiW(N) layer 30 does not negatively affect the Ti/Al ohmic contact formation and does not diffuse into the formed Ti/Al intermetallics. It also shows excellent adhesion to such Ti/Al intermetallics as well as low surface roughness after the aforementioned anneal steps, thereby facilitating a high quality contact between the TiW(N) layer and the metallization 30, e.g. Al metallization. In addition, the TiW(N) layer 32 also shows excellent adhesion to nickel and has proven to effectively prevent the diffusion of Aluminium metallization 30 into nickel during the aforementioned anneal steps.

The capping layer 32 is preferably deposited onto the contact metals 24, 26, 28 prior to patterning of the contacts 24, 26, 28. Particularly, the metal stacks of the respective contacts 24, 26 and 28 preferably are formed in a single run to avoid any exposure to air, which could cause oxidation. It is further preferred that the capping layer 32 is deposited immediately prior to this patterning step when depositing the capping layer 32 on a nickel Schottky contact 28 as will be explained in more detail later.

The capping layer 32 may be deposited in any suitable manner. A particularly suitable manner is through sputter deposition. In an embodiment, the capping layer 32 is deposited as a single layer. In one embodiment, the capping layer 32 comprises TiW(N) and is deposited as a stack of sub-layers, in which the TiW(N) sub-layer is sandwiched between a lower TiW sub-layer and an upper TiW sub-layer. This purges the reaction chamber of the sputtering device of residual nitrogen, such that subsequent sputter targets are not contaminated with residual nitrogen. Each of these sub-layers may be deposited using sputter deposition or any other suitable deposition technique. In another embodiment, the capping layer 32 may comprise only a TiW(N) layer i.e. without the lower TiW sub-layer and the upper TiW sub-layer. The TiW(N) sub-layer is preferably thicker than each of the TiW sub-layers and preferably thicker than the TiW sub-layers combined. For instance, in a current 4" silicon wafer process, the TiW sub-layers have a thickness of 10 nm and the TiW(N) sub-layer has a thickness of 80 nm to ensure that the bulk behaviour of the layer stack 30 is dominated by the properties of the TiW(N) sub-layer.

Figures 2A, 2B:
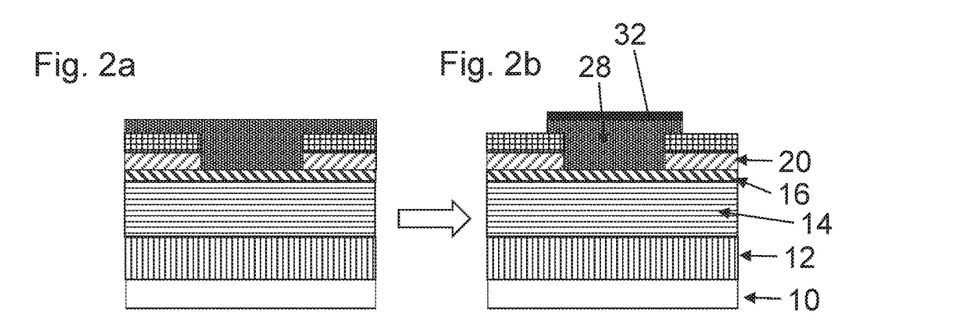
FIGS. 2a and 2b show a first example of the formation of a capping layer on a Schottky contact.

FIGS. 2a, 2b, 3a and 3b show two methods for application of the capping layer 32. FIG. 2a shows the substrate 10, buffer layer 12, the active layer stack 14, 16, the SiN passivation layer 20 and part of the SiN intermetal layer 22 after patterning and with the nickel Schottky contact 28 formed therein. Thus, the nickel contact is deposited and the gate anneal process performed. FIG. 2b shows the deposition of the capping layer followed by a single patterning step to form the contact and capping layer. The capping layer 32 can then be patterned to form the covered and uncovered regions.

Figures 3A, 3B:
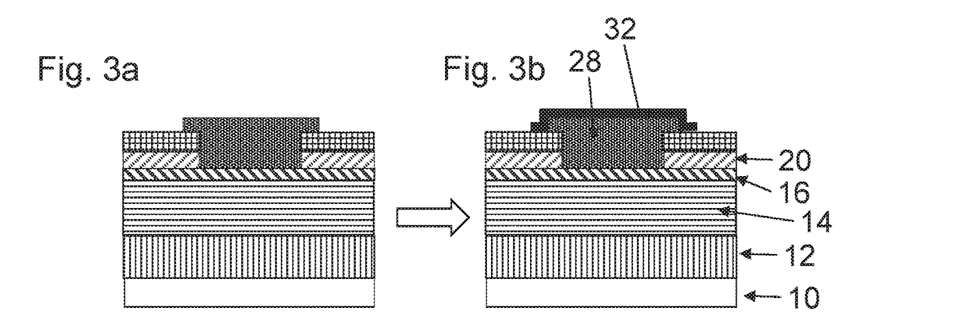
FIGS. 3a and 3b show a second example of the formation of a capping layer on a Schottky contact.

FIG. 3a shows the substrate 10, buffer layer 12, the active layer stack 14, 16, the SiN passivation layer 20 and part of the SiN intermetal of the insulating layer 22 after patterning and with the nickel Schottky contact 28 formed therein. Thus, the nickel Schottky contact 28 metal is deposited and then a first patterning step is performed. A gate anneal process is performed followed by deposition of the capping layer 32. A second pattering step is then performed. The process described in relation to FIGS. 3a, 3b results in the Schottky contact 28 being enveloped in the capping layer 32, which overlaps the part of the SiN intermetal of the insulating layer 22 or passivation layer. In contrast, the process described in relation to FIGS. 2a, 2b results in the Schottky contact 28 having the capping layer 32 only on its upper surface. The upper surface or "connection surface" provides an electrical connection to the contact by way of the backend metallisation.

The capping layer 32 may then be patterned to reveal part of the upper surface of the Schottky contact 28, as will be described below.

The capping layer has been found to be useful for overcoming delamination between the nickel Schottky contact 28 and the intermetal insulating layer 22 and passivation layer 20. Without wishing to be bound by theory, it is believed that the delamination of Ni takes place mainly due to the diffusion of hydrogen through Ni. A large amount of atomic hydrogen is present during the plasma enhanced chemical vapour deposition (PECVD) of the silicon nitride intermetal dielectric of the insulating layer 22, which is believed to lead to recombination at the interfaces of Ni to silicon nitride. In addition, PECVD silicon nitrides are known to contain a high amount of hydrogen bound to nitrogen. At subsequent anneal steps, H—N bonds can be broken, which again can lead to diffusion of hydrogen through the Ni Schottky contact 28. Although the former hydrogen diffusion process probably is more dominant, both sources of atomic hydrogen and the subsequent formation of H2 are believed to be the driving force behind delamination.

If a hydrogen diffusion barrier is applied between the silicon nitride hydrogen source and the Ni metal layer, delamination of Ni from silicon nitride is prevented. It has surprisingly been found that the capping layer 32 deposited directly on the Ni of the Schottky contact 28 prior to patterning of the Schottky gate has been proven to be very effective in suppressing such delamination. However, metal species from the capping layer may diffuse towards the Nickel contact decreasing the Schottky barrier. Further, the blocking of hydrogen by the capping layer may prevent the delamination but may also reduce the Schottky barrier stability. Further, the strain from the capping layer may negatively influences the Schottky barrier height. Patterning of the capping layer to form covered and uncovered regions has been found to maintain delamination and intermixing prevention without detrimentally effecting the Schottky barrier height.

The patterning of the capping layer 32 has surprisingly been found to maintain the advantages of suppressing delamination and metal intermixing while controlling the impact of the presence of the capping layer on the Schottky barrier height.

Figure 4:
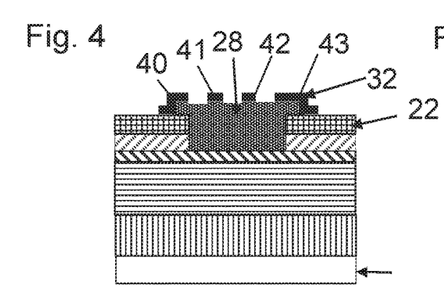
FIG. 4 shows a first example of a capping layer pattern.

FIGS. 4 to 7 show four examples of the patterning of the capping layer 32. FIG. 4 shows a capping layer formed by the process of FIGS. 3a and 3b described above. In FIG. 4 the capping layer is patterned to form a plurality of capping layer sub-sections, which comprise strips 40, 41, 42 and 43. The first strip 40 and the fourth strip 43 overlap the insulating layer 22. The strips 40 to 43 may comprise distinct subsections that are unconnected. Alternatively, the strips may be connected, for example at their ends. The lateral sides of the first contact are covered by capping material strips 40 and 43. The upper surface of the first contact, which is aligned with an area of the first contact, on the lower surface, that abuts the active layer 16, includes uncovered regions. Thus, the capping layer is patterned such that the covered regions separate the contact 28 from the dielectric material of the insulating layer 22 and the uncovered regions are located over an area open to the backend metallisation as shown in FIG. 1.

Figure 5:
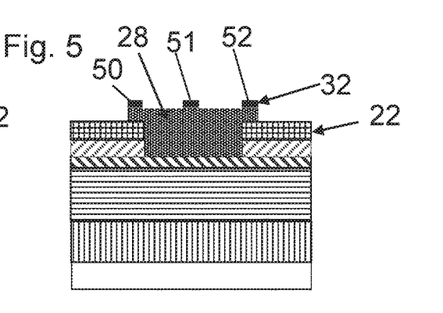
FIG. 5 shows a second example of a capping layer pattern.

FIG. 5 shows a capping layer 32 formed by the process of FIGS. 2a and 2b described above. In FIG. 5 the capping layer is patterned to form a plurality of capping layer sub-sections, which comprise three strips 50, 51 and 52. In this example, the strips of the capping layer 32 cover less of the nickel Schottky contact that that of FIG. 4. This has been found to reduce the leakage current in the assembled semiconductor device. It will be appreciated that the risk of delamination and intermixing with the backend metal may be greater than the embodiment of FIG. 4, but the Schottky barrier height has been found to be less effected by the capping layer 32.

Figure 6:
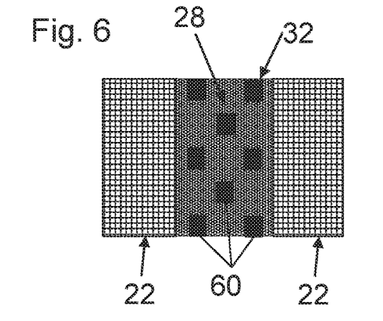
FIG. 6 shows a third example of a capping layer pattern.

FIG. 6 shows a top view of a further example of the patterned capping layer 32. In this example the capping layer has been patterned to leave a plurality of distinct dots 60. The capping layer material 32 has been removed from around the dots 60 to reveal the underlying Schottky contact 28 metal.

Figure 7:
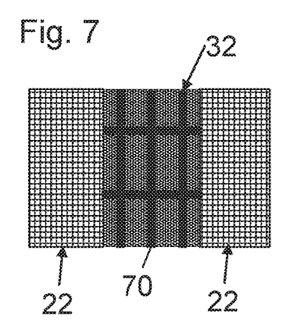
FIG. 7 shows a fourth example of a capping layer pattern.

FIG. 7 shows a top view of a further example of the patterned capping layer 32. In this example, the capping layer 32 has be patterned to leave a grid pattern 70. The capping layer material 32 has been removed from around the grid 70 to reveal the underlying Schottky contact 28 metal.

It will be appreciated that other patterns may be provided such that the capping layer includes covered and uncovered regions. The covered regions comprises parts in which the capping layer material covers the Schottky contact and uncovered regions comprising parts in which the capping layer material has been patterned to reveal the underlying Schottky contact. In this example, the Schottky metal (Nickel) which is in contact with the active layer is revealed.

In all of the examples of FIGS. 4 to 7 different capping layer area ratios of covered to uncovered regions may be presented. This can be used to achieve different Schottky barrier heights and thus leakage currents for the Schottky contact, while still acting to prevent delamination and intermixing. This also allows, on the same wafer, devices with different electrical characteristics to be fabricated.

Figure 8:
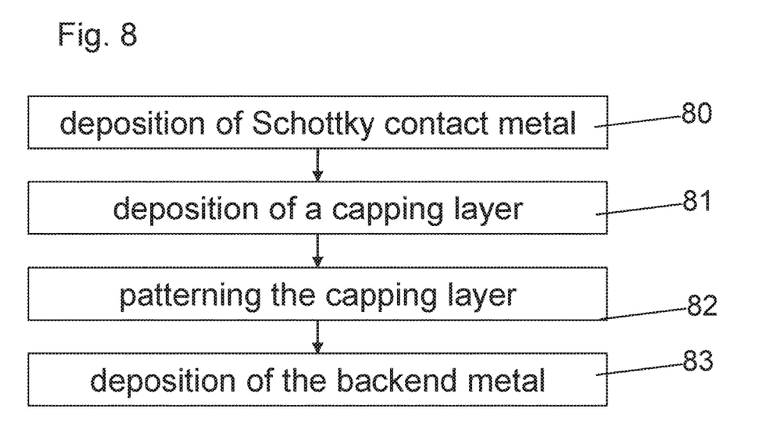
FIG. 8 shows a flow chart of controlling the Schottky barrier height of the fabricated semiconductor device using the pattern area of a capping layer.

FIG. 8 shows a method of fabrication of a semiconductor device including a step of controlling the Schottky barrier height during fabrication of a semiconductor device. Step 80 shows deposition of the Schottky contact metal. Step 81 shows deposition of a capping layer over the Schottky contact metal to cover the contact. Step 82 comprises step of controlling the Schottky barrier height by patterning the capping layer to achieve a particular area of covered Schottky contact to uncovered Schottky contact. The method may proceed to deposition of the backend metallisation over the patterned capping layer in step 83.

Figure 9:
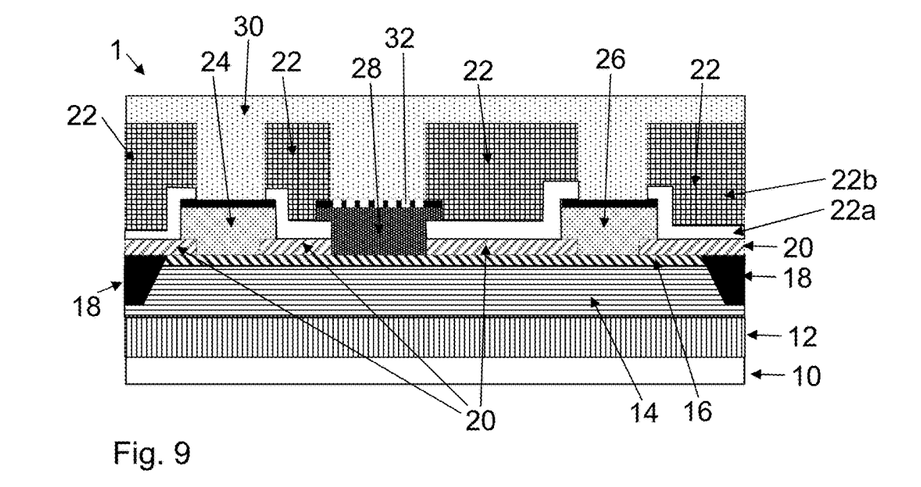
FIG. 9 shows schematically a semiconductor device similar to FIG. 1.

FIG. 9 shows a semiconductor device 1 similar to that of FIG. 1 and the same reference numeral have been used. In this example the electrically insulating material of the insulating layer 22 which laterally delimits the electrodes 24, 26, 28 comprises a plurality of layers. In particular, the inter-contact insulating later 22 comprises a first sub-layer 22a of Silicon Nitride that separates the contacts 24, 26, 28 and is formed on the passivation layer 20. The passivation layer 20 may be of Silicon Nitride. A second sub-layer 22b of Silicon oxide is formed on the first sub-layer 22a. The first and second sub-layers 22a, 22b may be deposited by a PECVD process. In a further embodiment, the intercontact insulating layer 22 comprises only silicon oxide.

In the embodiment of FIG. 9, the deposition (by PECVD) of the first sub-layer 22a is performed. This sub-layer 22a serves to protect the ohmic contacts 24, 26 from the Schottky contact patterning process. Contact holes to the ohmic source/drain regions are therefore etched through the PECVD silicon oxide sub-layer 22b with the PECVD silicon nitride sub-layer 22a below, while on the Schottky gates, the contact etch consists of an oxide etch only.

Figure 10:
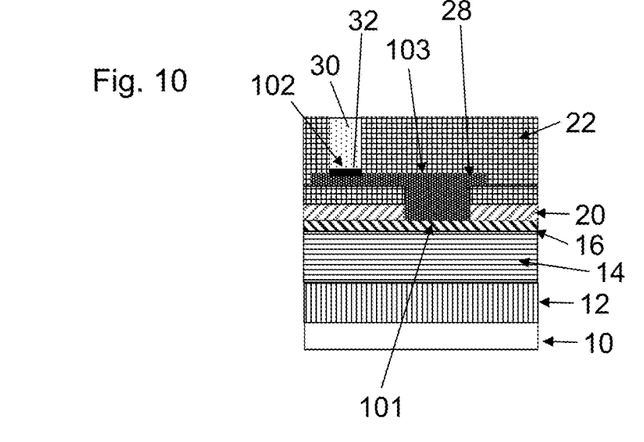
FIG. 10 shows a further example pattern.

In another example, shown schematically in FIG. 10, only part 101 of the lower surface of the contact may be in contact with the at least one active layer 14, 16. Further, only part 102 of the upper surface may provide a connection with the backend metallisation. These parts 101, 102 of the upper and lower surface may be offset from one another. This arrangement may be advantageous as the contact can act as a field plate. It may be advantageous for the part 102 of the upper surface providing the connection to the backend metallisation to comprise a covered region while a part 103 of the upper surface opposite the part 101 of the lower surface in contact with the active layer 14, 16 is an uncovered region. Further, the ratio of covered to uncovered regions over the part of the contact that connects to the backend metallisation may be greater than the ratio over the part of the upper surface opposite the active layer contact point.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A HEMT comprising at least one active layer on a substrate and a first contact to the at least one active layer, the first contact comprising a contact metal in contact with the at least one active layer and a capping layer on the contact metal, the capping layer comprising a conductive layer, wherein the capping layer forms a pattern comprising regions of the first contact covered by the capping layer and regions of the first contact that are uncovered, and
   wherein the pattern divides the capping layer into a plurality of strips or a plurality of dots, and
   wherein the first contact comprises a Schottky contact.

2. The HEMT according to claim 1, in which the capping layer comprises a hydrogen barrier material.

3. The HEMT according to claim 1, in which the capping layer comprises at least one of:
   a metal layer of a metal different to that of the contact metal;
   a layer of titanium and tungsten; or
   a titanium tungsten nitride TiW(N) layer.

4. The HEMT according to claim 1, in which the device comprises a backend metal layer on the patterned capping layer.

5. The HEMT according to claim 1, in which the first contact is laterally delimited by an electrically insulating material.

6. The HEMT according to claim 1, in which the capping layer is formed on a connection surface of the contact, which provides an electrical connection to the contact, wherein the area of the uncovered region(s) is greater over an area of the connection surface opposite where the contact contacts the at least one active layer than the remainder of the connection surface.

7. The HEMT according to claim 5, further comprising:
a backend metal; and
the pattern comprising the covered regions and the uncovered regions,
wherein the covered regions abut the electrically insulating material and the uncovered regions abut a backend metal layer.

8. The HEMT according to claim 5, in which the electrically insulating layer comprises, at least in part, silicon oxide.

9. The HEMT according to claim 8, in which the electrically insulating layer comprises a sub-layer of silicon nitride formed on a passivation layer and a sub-layer of silicon oxide formed on the sub-layer of silicon nitride.

10. The HEMT according to claim 1, in which the first contact comprises a gate contact and the semiconductor device includes a further contact, the further contact comprising one of a source and drain contact.

11. An integrated circuit including HEMT comprising at least one active layer on a substrate and a first contact to the at least one active layer, the first contact comprising a contact metal in contact with the at least one active layer and a capping layer on the contact metal, the capping layer comprising a conductive layer, wherein the capping layer forms a pattern comprising regions of the first contact covered by the capping layer and regions of the first contact that are uncovered, and
wherein the pattern divides the capping layer into a plurality of strips or a plurality of dots; and
wherein the first contact comprises a Schottky contact.

12. HEMT comprising at least one active layer on a substrate and a first contact to the at least one active layer, the first contact being laterally delimited by an electrically insulating material and comprising a contact metal in contact with the at least one active layer;
a capping layer on the contact metal, the capping layer comprising a conductive layer, wherein the capping layer forms a pattern comprising regions of the first contact covered by the capping layer and regions of the first contact that are uncovered; and
a backend metal;
wherein the pattern divides the capping layer into a plurality of strips or a plurality of dots;
wherein the pattern comprises the covered regions and the uncovered regions,
wherein the first contact comprises a Schottky contact; and
wherein the covered regions abut the electrically insulating material and the uncovered regions abut a backend metal layer.

* * * * *